US011574982B2

(12) United States Patent
Okabe et al.

(10) Patent No.: US 11,574,982 B2
(45) Date of Patent: Feb. 7, 2023

(54) DISPLAY DEVICE

(71) Applicant: SHARP KABUSHIKI KAISHA, Sakai (JP)

(72) Inventors: Tohru Okabe, Sakai (JP); Ryosuke Gunji, Sakai (JP); Hiroki Taniyama, Sakai (JP); Shinji Ichikawa, Sakai (JP); Takeshi Yaneda, Osaka (JP); Hiroharu Jinmura, Yonago (JP); Yoshihiro Nakada, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 272 days.

(21) Appl. No.: 16/964,852

(22) PCT Filed: Jan. 31, 2018

(86) PCT No.: PCT/JP2018/003259
§ 371 (c)(1),
(2) Date: Jul. 24, 2020

(87) PCT Pub. No.: WO2019/150503
PCT Pub. Date: Aug. 8, 2019

(65) Prior Publication Data
US 2021/0066440 A1    Mar. 4, 2021

(51) Int. Cl.
*H01L 27/32*     (2006.01)
(52) U.S. Cl.
CPC ...... *H01L 27/3276* (2013.01); *H01L 27/3258* (2013.01); *H01L 2251/5338* (2013.01)

(58) Field of Classification Search
CPC ............. H01L 51/0097; H01L 51/5253; H01L 27/3258; H01L 27/3279; H01L 27/124; H01L 27/3276
See application file for complete search history.

(56) References Cited

U.S. PATENT DOCUMENTS

| | | | |
|---|---|---|---|
| 8,779,296 B2* | 7/2014 | Katsui | G02F 1/136286 174/250 |
| 2012/0120616 A1* | 5/2012 | Katsui | H01L 27/3276 174/257 |
| 2014/0353670 A1 | 12/2014 | Youn et al. | |
| 2015/0287750 A1 | 10/2015 | Youn et al. | |
| 2016/0087022 A1* | 3/2016 | Tsai | H01L 27/1225 257/40 |
| 2017/0040406 A1* | 2/2017 | Park | H01L 51/56 |
| 2017/0092708 A1* | 3/2017 | Jeon | H01L 27/3258 |
| 2017/0243932 A1* | 8/2017 | Ohara | H01L 27/3248 |
| 2017/0262109 A1* | 9/2017 | Choi | H01L 27/3258 |
| 2018/0108723 A1* | 4/2018 | Nishimura | H01L 51/5253 |
| 2018/0138431 A1* | 5/2018 | Nishimura | H01L 51/5237 |
| 2018/0342707 A1* | 11/2018 | Lee | H01L 51/5253 |

(Continued)

FOREIGN PATENT DOCUMENTS

EP    2461309 A1 *  6/2012    ....... G02F 1/136286
JP    2014-232300 A    12/2014
(Continued)

*Primary Examiner* — Errol V Fernandes
*Assistant Examiner* — Jeremy J Joy
(74) *Attorney, Agent, or Firm* — ScienBiziP, P.C.

(57) ABSTRACT

A slit has ends each close to one of a display area and a terminal. The ends are each formed of a stepwise side face, including etch stop films.

19 Claims, 10 Drawing Sheets

(56) References Cited

U.S. PATENT DOCUMENTS

2019/0341442 A1\* 11/2019 Kajiyama .............. H05B 33/12
2019/0355800 A1\* 11/2019 Saitoh ................. H01L 27/3246

FOREIGN PATENT DOCUMENTS

| JP | 2018066819 A | \* | 4/2018 | ......... H01L 27/1218 |
| WO | WO-2011013434 A1 | \* | 2/2011 | ....... G02F 1/136286 |
| WO | WO-2016048385 A1 | \* | 3/2016 | ......... H01L 27/1225 |
| WO | WO-2016060089 A1 | \* | 4/2016 | ........ H01L 27/3248 |
| WO | WO-2018135127 A1 | \* | 7/2018 | ............... G09F 9/00 |
| WO | WO-2020238437 A1 | \* | 12/2020 | ............. G09F 9/301 |

\* cited by examiner

DISPLAY DEVICE

TECHNICAL FIELD

The disclosure relates to a display device.

BACKGROUND ART

Patent Document 1 discloses a display device including a bending area formed to fold the display device.

CITATION LIST

Patent Literature

[Patent Document 1] Japanese Unexamined Patent Application Publication No. 2014-232300 (published on Dec. 11, 2014)

SUMMARY

Technical Problem

The bending area (also referred to as "slit"), included in the typical display device disclosed in Patent Document 1, has a side face tapered (angled) relatively steeply. If a plurality of lead wiring lines are patterned to intersect with the bending area, the relatively steeply tapered (angled) side face is likely to create a residue in an area between the lead wiring lines, and thus to unfortunately cause a leak between the lead wiring lines.

In view of the above problems, the disclosure intends to provide a display device in which the leak decreases between the lead wiring lines formed in the slit.

Solution to Problem

In order to overcome the above problems, a display device according to the disclosure includes, on a substrate, a display area including a plurality of display elements and a plurality of active elements, a frame area provided around the display area, and a plurality of terminals provided to an end of the frame area to each correspond to one of a plurality of lead wiring lines. The display device includes: a plurality of inorganic film layers formed on the substrate, the inorganic film layers including at least a first inorganic film layer and a second inorganic film layer above the first inorganic film layer; and a slit formed in the frame area and between the display area and the terminals, the slit being formed in the inorganic film layers, wherein the slit includes a first slit formed in the first inorganic film layer and a second slit formed in the second inorganic film layer, the first slit has ends in a lengthwise direction of the lead wiring lines, at least one of the ends being provided with a first etch stop layer on the first inorganic film, and a width, of the second slit, in the lengthwise direction of the lead wiring lines is greater than a width, of the first slit, in the lengthwise direction of the lead wiring lines.

In the above features, the slit includes a stepwise side face including the first etch stop layer, allowing the display device to reduce a leak between lead wiring lines formed in the slit.

Advantageous Effects of Disclosure

An aspect of the disclosure makes it possible to provide a display device in which a leak decreases between lead wiring lines formed in a slit.

DESCRIPTION OF EMBODIMENTS

Figure 1:
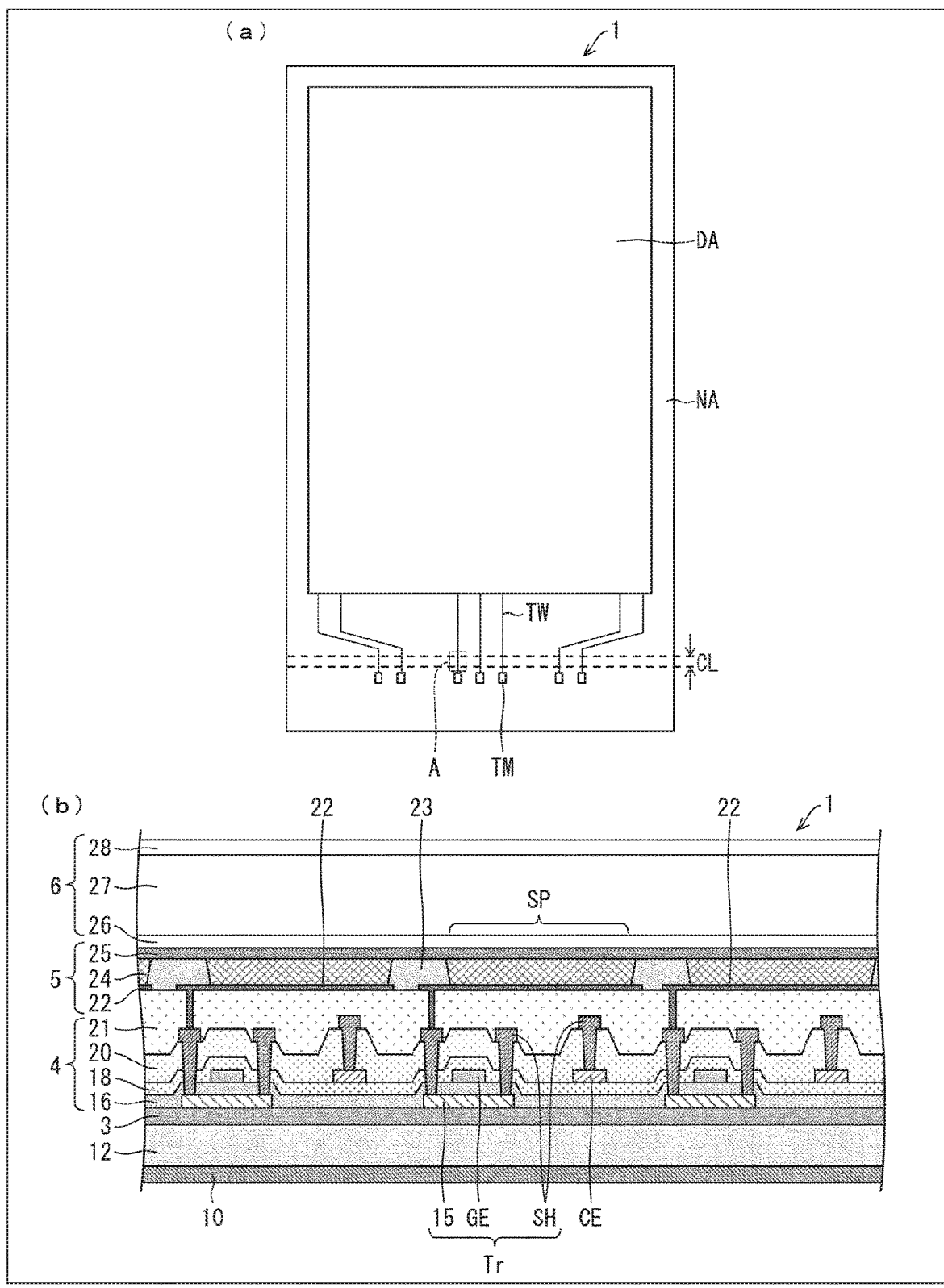
FIG. 1 illustrates a schematic configuration of a flexible organic electroluminescent (EL) display device according to a first embodiment.

Described below are embodiments of the disclosure, with reference to FIGS. 1 to 9. In the detailed description that follows, identical constituent features have the same reference numerals for the sake of description. Such constituent features will not be repeatedly elaborated.

Note that, in the embodiments below, an organic EL element is recited as an example of a display element (an optical element). However, the display element shall not be limited to the organic EL element. For example, the display element may be a reflective liquid crystal display element having its brightness and transmittance controlled by voltage, and eliminating the need of a backlight.

The above display element (the optical element) may also be an optical element having its brightness and transmittance controlled by current. An example of the optical element to be controlled by current includes an organic EL display including an organic light-emitting diode (OLED), an EL display such as an inorganic EL display including an inorganic light-emitting diode, or a quantum dot light-emitting diode (QLED) display including a QLED.

First Embodiment

Described below are flexible organic EL display devices 1, 1*a*, and 1*b* according to a first embodiment of the disclosure with reference to FIGS. 1 to 4, and a flexible organic EL display device 50 according to a comparative example with reference to FIG. 5.

FIG. 1 illustrates a schematic configuration of the flexible organic EL display device 1 according to the first embodiment.

With reference to FIG. 1(*b*), manufacturing steps of the flexible organic EL display device 1 are described.

First, a resin layer 12 is formed on a translucent support substrate (e.g., a mother glass substrate) (Step S1). The translucent support substrate is removed and replaced with a lower-face film 10 in a downstream step. Then, a barrier layer 3 is formed (Step S2). Then, a TFT layer 4 including a terminal TM and a lead wiring line TW is formed (Step S3). Then, an organic EL element layer 5, namely, a light-emitting element layer, is formed as a display element (Step S4). Then, a sealing layer 6 is formed (Step S5). Then, a not-shown upper-face film is attached to the sealing layer 6 (Step S6). Note that, as a matter of course, the step to attach the not-shown upper-face film to the sealing layer 6 may be omitted as appropriate when, for example, a touch panel is disposed on the sealing layer 6 through a bonding layer. Then, a laser beam is emitted to a lower face of the resin layer (a first resin layer) 12 through the support substrate to reduce the bonding force between the support substrate and the resin layer 12. The support substrate is removed from the resin layer 12 (Step S7). This step is also referred to as a laser-lift-off (LLO) step. Then, the lower-face film 10 is attached through a bonding layer to a face, of the resin layer 12, from which the support substrate is removed (Step S8). Then, a stack including the lower-face film 10, the resin layer 12, the barrier layer 3, the TFT layer 4, the organic EL element layer 5, the sealing layer 6, and the upper-face film is cut into pieces (Step S9). Then, an electronic circuit board (e.g., an integrated circuit (IC) chip) is press-fitted and mounted onto the terminal TM at an edge of an obtained piece, using an anisotropic conductive film (ACF) (Step S10). Then, the edge is folded (the piece is folded 180° along a folding slit CL illustrated in FIG. 1). The flexible organic EL display device 1 is completed (Step S11). Then, the flexible organic EL display device 1 is inspected for disconnection. If a disconnection is found, the disconnection is repaired (Step S12).

Examples of materials of the resin layer 12 include, but not limited to, a polyimide resin, an epoxy resin, and a polyamide resin.

An example of a material of the lower-face film 10 includes, but not limited to, polyethylene terephthalate (PET).

While the flexible organic EL display device 1 is in use, the barrier layer 3, namely, a first inorganic film layer (an inorganic moisture-resistant layer) 3, prevents water and an impurity from reaching the TFT layer 4 and the organic EL element layer 5. The barrier layer 3 can include, for example, a silicon oxide film, a silicon nitride film, or a silicon oxide nitride film formed by the chemical vapor deposition (CVD). Alternatively, the inorganic barrier layer 3 can include a multilayer film including these films.

The TFT layer 4 is disposed above the resin layer 12 and the barrier layer 3. The TFT layer 4 includes: a semiconductor film 15; an inorganic insulating film 16, namely, a second inorganic film layer (a gate insulating film layer) 16 above the semiconductor film 15; a gate electrode GE above the inorganic insulating film 16; an inorganic insulating film 18, namely, a third inorganic film layer (a first inorganic insulating film layer) 18 above the gate electrode GE; a capacitance electrode CE above the inorganic insulating film 18; an inorganic insulating film 20, namely, a fourth inorganic film layer (a second inorganic insulating film layer) 20 above the capacitance electrode CE; a source and drain wiring line SH including a source and drain electrode, and the terminal TM above the inorganic insulating film 20; and a planarization film (a second resin layer) 21 above the source and drain wiring line SH and the terminal TM.

The semiconductor film 15, the inorganic insulating film 16, the gate electrode GE, the inorganic insulating film 18, the inorganic insulating film 20, the source and drain wiring line SH constitute a TFT Tr acting as an active element.

Note that the flexible organic EL display device 1 includes a display area DA and a frame area NA both at least partially provided with a plurality of common inorganic films. The common inorganic films include the barrier layer 3, and the inorganic insulating films 16, 18, and 20.

The frame area NA disposed outside the display area DA of the flexible organic EL display device 1 illustrated in FIG. 1(*a*) includes: a plurality of the terminals TM to be used for connecting to an electronic circuit board such as an IC chip and a flexible printed circuit board (FPC); and a plurality of the lead wiring lines TW connecting together the terminals TM and, for example, wiring lines of the display area DA. The terminals TM are provided to an end of the frame area NA.

The semiconductor film 15 includes, for example, a low-temperature polysilicon (LPTS) or an oxide semiconductor. Note that, in FIG. 2, the TFT is of a top-gate structure, using the semiconductor film 15 as a channel. Alternatively, the TFT may be of a bottom-gate structure (when, for example, the channel of the TFT is an oxide semiconductor).

The gate electrode GE, the capacitance electrode CE, the source and drain wiring line SH, the lead wiring line TW, and the terminal TM include a monolayer film including at least one of such metals as aluminum (Al), tungsten (W), molybdenum (Mo), tantalum (Ta), chromium (Cr), titanium (Ti), and copper (Cu), or a multilayer film including these metals.

The inorganic insulating films 16, 18, and 20 can include, for example, a silicon oxide (SiOx) film, or a silicon nitride (SiNx) film formed by the CVD. Alternatively, the inorganic insulating films 16, 18, and 20 can include a multilayer film including these films.

The planarization film (an interlayer insulating film) 21 can include, for example, an applicable and photosensitive organic material such as a polyimide resin and an acrylic resin.

The organic EL element layer 5 includes: an anode 22 above the planarization film 21; a bank 23 covering an edge of the anode 22; an EL layer 24 above the anode 22; and a cathode 25 above the EL layer 24. For each sub pixel SP, the organic EL element layer 5 includes the anode 22 shaped into an island, the EL layer 24, and the cathode 25. The bank (an anode edge cover) 23 may include, for example, an applicable and photosensitive organic material such as a polyimide resin and an acrylic resin. The organic EL element layer 5 forming the display area DA is provided above the TFT layer 4.

The EL layer 24 includes, for example, a hole-injection layer, a hole-transport layer, a light-emitting layer, an electron-transport layer, and an electron-injection layer stacked on top of another from below. The light-emitting layer is shaped into an island for each sub pixel by vapor deposition or an ink-jet technique. The other layers are shaped into islands or a monolithic form. Moreover, the EL layer 24 may omit one or more of the hole-injection layer, the hole-transport layer, the electron-transport layer, and the electron-injection layer.

The anode (a positive electrode) 22 is formed of, for example, indium tin oxide (ITO) and an alloy including Ag stacked on top of each other. The anode 22 reflects light. The cathode electrode 25 can include a translucent conductive material such as ITO and indium zinc oxide (IZO).

In the organic EL element layer 5, a drive current between the anode 22 and the cathode 25 recombines holes and electrons together in the EL layer 24. The recombination forms an exciton which falls to the ground state, thereby emitting light. Since the cathode 25 is translucent and the anode 22 is light-reflective, the light emitted from the EL layer 24 travels upward. This is how the light-emitting device layer 5 is of a top emission type.

The sealing layer 6, which is translucent, includes: a first inorganic sealing film 26 covering the cathode 25; an organic sealing film 27 formed above the first inorganic sealing film 26; and a second inorganic sealing film 28 covering the organic sealing film 27. The sealing layer 6 covering the organic EL element layer 5 prevents such foreign objects as water and oxygen from penetrating into the organic EL element layer 5.

Each of the first inorganic sealing film 26 and the second inorganic sealing film 28 can include a silicon oxide film, a silicon nitride film, or a silicon oxide nitride film formed by, for example the CVD. Alternatively, the first inorganic sealing film 26 and the second inorganic sealing film 28 can include a multilayer film including these films. The organic sealing film 27 is a translucent organic film thicker than the first inorganic sealing films 26 and the second inorganic sealing film 28. The organic sealing film 27 can include an applicable and photosensitive organic material such as a polyimide resin and an acrylic resin.

As can be seen, recited as an example is a case where the flexible organic EL display device 1 is produced in the manufacturing steps including the LLO step. However, the manufacturing steps are not limited to the above ones. Alternatively, for example, if the support substrate is a flexible substrate having high heat resistance up to temperatures of Steps S1 to S5 described above, such a step as replacement of the substrate is unnecessary. Accordingly, Steps S7 and S8 described above can be omitted.

As illustrated in FIG. 1(a), the folding slit CL is formed in a portion of the frame area NA on the lower-face film 10 in one of the pieces. The folding slit CL is formed as a single opening across opposing ends, of the portion of the frame area NA, in a horizontal direction of the drawing (c.f., a second direction) orthogonal to a vertical direction of the drawing (c.f., a first direction); that is, a lengthwise direction of the lead wiring lines TW.

Note that each of the terminals TM in FIG. 1(a) is a part of a corresponding one of the lead wiring lines TW to input from outside a signal to one or more of the TFTs Tr illustrated in FIG. 1(b). That is, each terminal TM, formed slightly thick, is a part of the corresponding lead wiring line TW.

Figure 2:
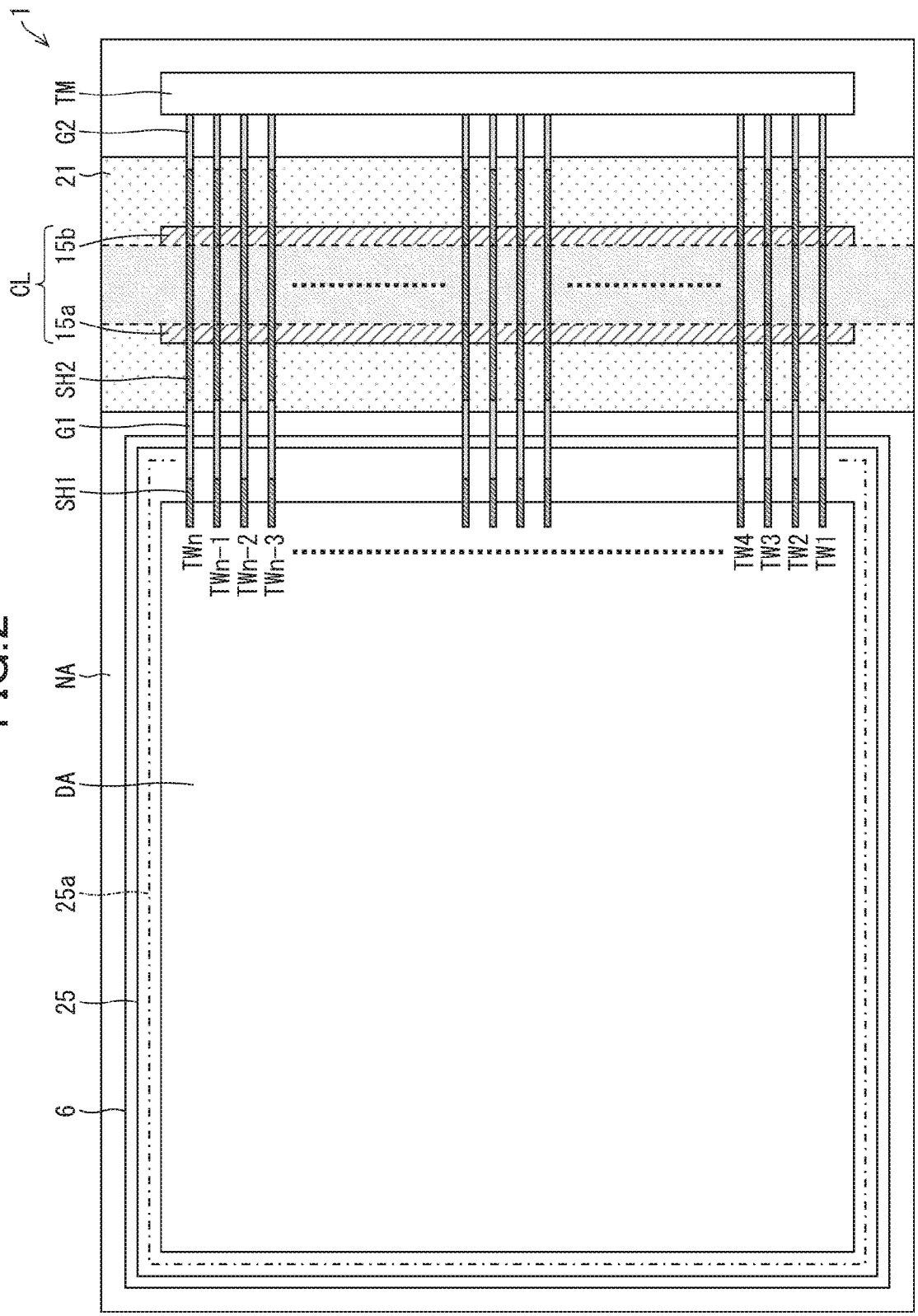
FIG. 2 is a plan view illustrating a schematic configuration of the flexible organic EL display device including a top-gate thin-film transistor (TFT) element according to the first embodiment.

FIG. 2 is a plan view illustrating a schematic configuration of the flexible organic EL display device 1 including a top-gate TFT element according to this embodiment.

Figure 3:
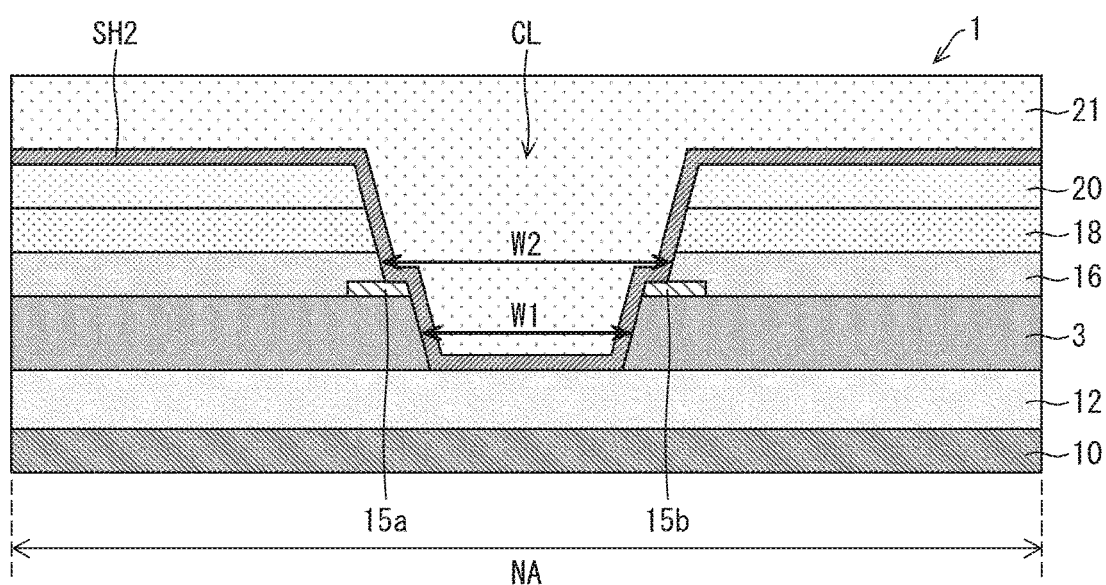
FIG. 3 is a cross-section view illustrating a folding slit formed in a frame area of the flexible organic EL display device according to the first embodiment.
Figure 4:
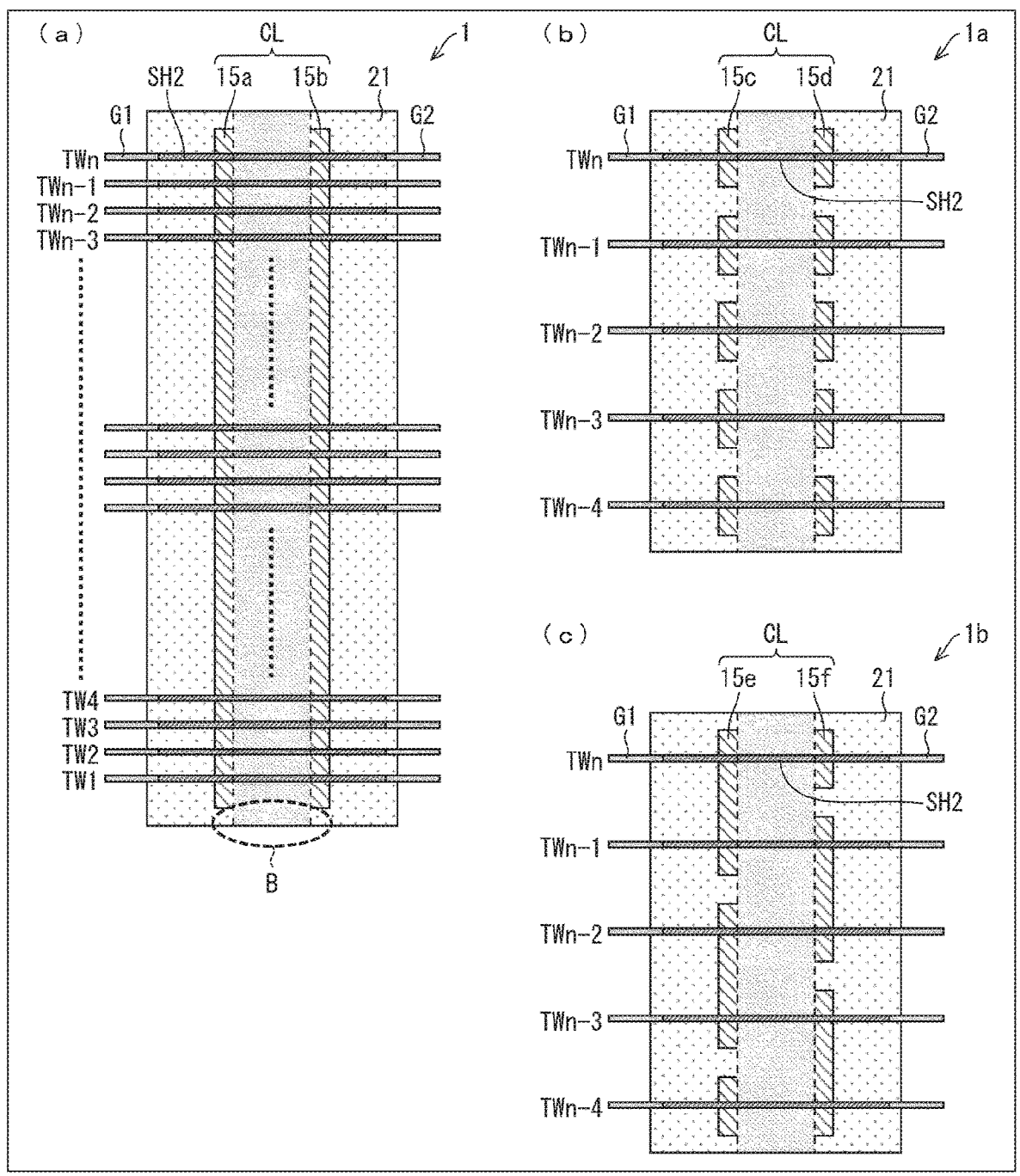
FIG. 4(a) illustrates shapes of etch stop films included in the flexible organic EL display device according to the first embodiment.
FIG. 4(b) and FIG. 4(c) illustrate modifications of the etch stop films.

FIG. 3 is a cross-section view illustrating a portion A of the flexible organic EL display device 1 illustrated in FIG. 1(a).

As illustrated in FIGS. 2 and 3, the inorganic films in the display area DA, and the slit CL with the inorganic films partially removed are formed in the frame area NA, above the lower-face film 10 and the resin layer 12, between the display area DA and the terminal TM. The inorganic films include the barrier layer 3, and the inorganic insulating films 16, 18, and 20.

The slit CL has ends each close to one of the display area DA and the terminal TM. The ends are each formed of a stepwise side face, including etch stop films (first etch stop layers) 15a and 15b also referred to as pillow layers.

As illustrated in FIG. 3, formed above the lower-face film 10 and the resin layer 12 are a plurality of inorganic film layers including, at least, the barrier layer (the first inorganic film layer) 3, and the inorganic insulating film (the second inorganic film layer) 16 above the barrier layer 3. The slit CL is formed in the inorganic film layers.

The slit CL includes: a first slit formed in the barrier layer (the first inorganic film layer) 3 and having a width W1 in a lengthwise direction of the lead wiring lines TW; and a second slit formed in the inorganic insulating film (the second inorganic film layer) 16 and having a width W2 in the lengthwise direction of the lead wiring lines TW.

The first slit has ends in the lengthwise direction of the lead wiring lines TW. Each of the ends is provided with one of the etch stop films (the first etch stop layers) 15a and 15b on the barrier layer (the first inorganic film layer) 3. The width W2, of the second slit, in the lengthwise direction of the lead wiring lines TW is greater than the width W1, of the first slit, in the lengthwise direction of the lead wiring lines TW.

Moreover, as illustrated in FIG. 3, the side faces of the first slit and the side faces of the etch stop films 15a and 15b may coincide at the ends, of the first slit, provided with the etch stop films 15a and 15b.

Here, what the side faces of the first slit and the side faces of the etch stop films 15a and 15b coincide means that the side faces of the barrier layer (the first inorganic film layer) 3 coincide with the side faces of the etch stop films 15a and 15b so that the etch stop films 15a and 15b function to keep the barrier layer (the first inorganic film layer) 3 from being etched in patterning such as dry etching. The term "coincide" is not limited in a strict sense alone, but is interpreted in a sense that the side faces of the barrier layer 3 and the side faces of the etch stop films 15a and 15b merely coincide in patterning.

Note that, in the flexible organic EL display device 1, the slit CL has the ends each close to one of the display area DA and the terminal TM. The ends are each formed of a stepwise side face, including the etch stop films 15a and 15b. Alternatively, one such stepwise side face may be formed at only one end of the slit CL.

In this embodiment, the etch stop films 15a and 15b are formed, using the same layer as the semiconductor film 15. The etch stop films 15a and 15b can be formed of, for example, a silicon film or an oxide semiconductor film.

In this embodiment, the etch stop films 15a and 15b are formed of a silicon film or an oxide semiconductor film, and thus are likely to crack when the stack including the lower-face film 10, the resin layer 12, the barrier layer 3, the TFT layer 4, the organic EL element layer 5, and the sealing layer 6 is cut out. Hence, the etch stop films 15a and 15b are formed not near an area of the cut out. Instead, as illustrated in FIG. 2, each of the etch stop films 15a and 15b is shaped into an island formed along a side face of the slit CL to overlap lead wiring lines TW1 to TWn in plan view and not to have contact with an end of the lower-face film 10.

The shape of the etch stop films 15a and 15b shall not be limited to the above shape. If the above stack is cut out with, for example, a laser beam, the risk of the crack in the etch stop film 15a and 15b can be reduced. In such a case, each of the etch stop films 15a and 15b may be formed to have contact with the end of the lower-face film 10.

Note that, as illustrated in FIG. 2, each of the lead wiring lines TW1 to TWn includes a first conductive member SH1, a second conductive member SH2, a third conductive member GH1, and a fourth conductive member G2. The first conductive member SH1 and the second conductive member SH2 are formed in the same layer as the above source and drain wiring line SH. The third conductive member G1 and the fourth conductive member G2 are formed in the same layer as the above gate electrode GE. Each of the terminals TM corresponding one of the lead wiring lines TW1 to TWn is formed in the same layer as the above source and drain wiring line SH.

The sealing layer 6 in FIG. 2 is illustrated to show an area of the sealing layer 6 to be formed. The cathode 25 in FIG. 2 is illustrated to show an area of the cathode 25 to be formed. A conduction portion 25a in FIG. 2 is illustrated to show a conduction portion between the cathode 25 and a wiring line for the cathode 25.

As illustrated in FIGS. 2 and 3, the lead wiring lines TW1 to TWn intersect with the slit CL, and make contact with the etch stop films 15a and 15b.

Moreover, as illustrated in FIG. 3, the slit CL is formed to expose the resin layer 12. Each of the lead wiring lines TW1 to TWn has a portion, namely, the second conductive member SH2, formed to make contact with the resin layer 12.

Note that, in this embodiment, the second conductive member SH2 of each of the lead wiring lines TW1 to TWn is formed to be covered with the planarization film 21 as illustrated in FIGS. 2 and 3 to be kept from damage caused when the anode 22 is patterned. However, the formation of the second conductive member SH2 shall not be limited to this formation.

As can be seen, the folding slit CL formed in the frame area NA of the flexible organic EL display device 1 according to this embodiment includes the stepwise side faces including the etch stop films 15a and 15b. When the lead wiring lines TW1 to TWn are patterned in the slit CL, such a feature makes it possible to reduce a residue between the lead wiring lines TW1 to TWn, contributing to reducing a leak between the lead wiring lines TW1 to TWn.

FIG. 4(a) illustrates shapes of the etch stop films 15a and 15b included in the flexible organic EL display device 1. FIG. 4(b) and FIG. 4(c) illustrate modifications of the etch stop films.

As illustrated in FIG. 4(a), the etch stop films 15a and 15b included in the flexible organic EL display device 1 are formed of a silicon film or an oxide semiconductor film, and the shape of such etch stop films 15a and 15b is likely to cause a crack when the stack is cut out. Hence, the etch stop films 15a and 15b are not formed near the area of the cut out; that is, for example, the etch stop films 15a and 15b are not formed in a portion B illustrated in FIG. 4(a).

As illustrated in FIG. 4(b), a flexible organic EL display device 1a may include etch stop films 15c and 15d each shaped into a plurality of islands formed along a side face of the slit CL. The islands of the films may be formed to make contact with the lead wiring lines TW1 to TWn. That is, each of the islands of the films may be formed to make contact with a corresponding one of the lead wiring lines TW1 to TWn.

As illustrated in FIG. 4(c), a flexible organic EL display device 1b may include etch stop films 15e and 15f each shaped into a plurality of islands formed along a side face of the slit CL. At least one of the islands of the films may be formed to make contact with each of two or more of the lead wiring lines TW1 to TWn.

Figure 5:
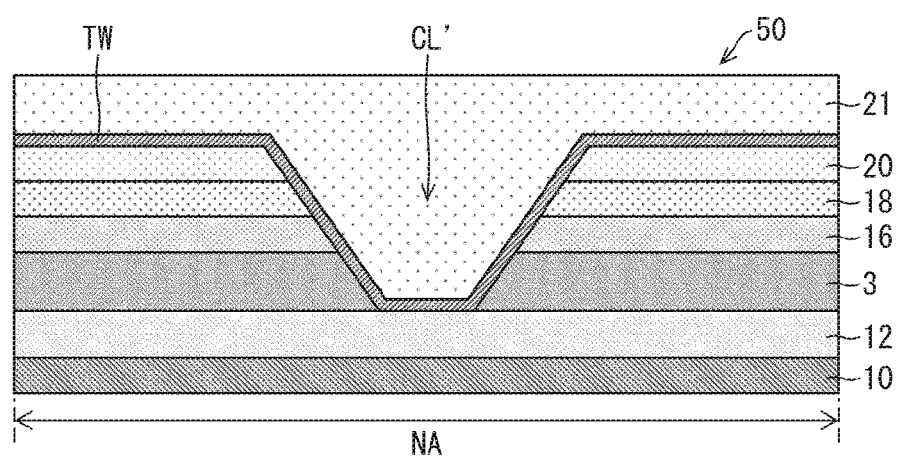
FIG. 5 is a cross-section view illustrating a folding slit included in a flexible organic EL display device in a comparative example.

FIG. 5 is a cross-section view illustrating a folding slit CL' included in a flexible organic EL display device 50 in a comparative example.

In the flexible organic EL display device 50 illustrated in FIG. 5, the folding slit CL' is formed to remove all the inorganic layers stacked one another including the barrier layer 3 and the inorganic insulating films 16, 18, and 20.

The folding slit CL' included in the flexible organic EL display device 50 has a side face tapered (angled) relatively steeply. If the lead wiring lines TW are patterned to intersect with the folding slit CL', the relatively steeply tapered (angled) side face is likely to create a residue in an area between the lead wiring lines TW, and thus to unfortunately cause a leak between the lead wiring lines TW.

Second Embodiment

Figure 6:
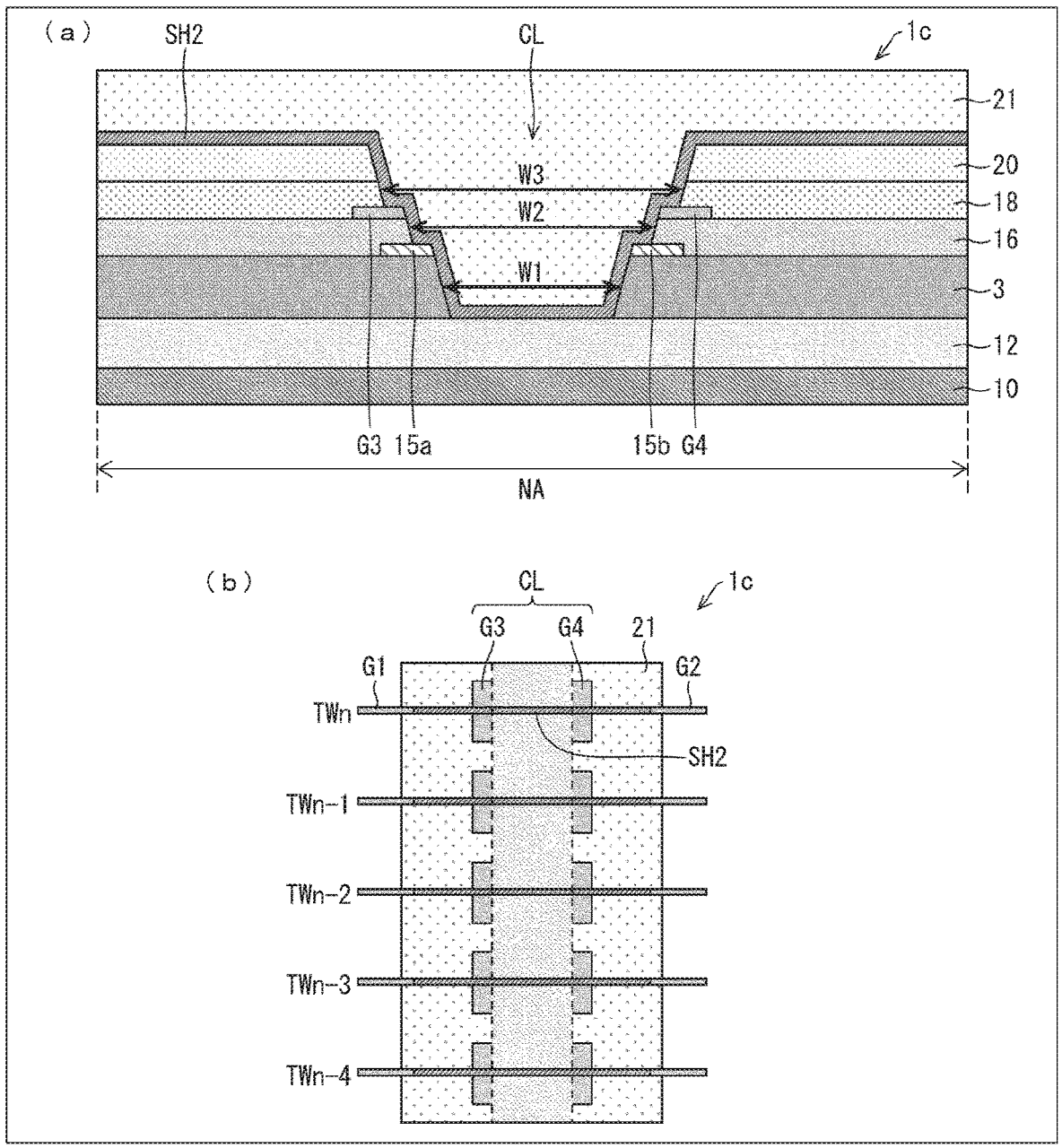
FIG. 6(a) is a cross-section view illustrating a folding slit formed in a frame area of a flexible organic EL display device including a top-gate TFT element according to a second embodiment.
FIG. 6(b) illustrates shapes of etch stop films included in the flexible organic EL display device according to the second embodiment.

Described next is a second embodiment of the disclosure, with reference to FIG. 6. A flexible organic EL display device 1c according to this embodiment is different from the flexible organic EL display devices according to the first embodiment. In addition to the etch stop films (the first etch stop layers) 15a and 15b formed using the same layer as the semiconductor film 15, the flexible organic EL display device 1c further includes etch stop films (second etch stop layers) G3 and G4 formed in the same layer as the gate electrode GE and above the etch stop films 15a and 15b. Other features are the same as those described in the first embodiment. In the detailed description that follows, identical constituent features have the same reference numerals between the drawings in this embodiment and the first embodiment for the sake of description. Such constituent features will not be repeatedly elaborated.

FIG. 6(a) is a cross-section view illustrating the folding slit CL formed in the frame area NA of the flexible organic EL display device 1c including a top-gate TFT element. FIG. 6(b) illustrates shapes of portions of the etch stop films G3 and G4 included in the flexible organic EL display device 1c. Note that FIG. 6(b) omits the illustrations of the etch stop films 15a and 15b.

As illustrated in FIG. 6(a), the slit CL has ends each close to one of the display area DA and the terminal TM. The ends are each formed of a stepwise side face, including the etch stop films 15a, 15b, G3 and G4.

As illustrated in FIG. 6(a), formed above the lower-face film 10 and the resin layer 12 are a plurality of inorganic film layers including, at least, the barrier layer (the first inorganic film layer) 3, the inorganic insulating film (the second inorganic film layer) 16 above the barrier layer 3, and the inorganic insulating film (the third inorganic film layer) 18 above the inorganic insulating film 16. The slit CL is formed in the inorganic film layers.

The slit CL includes: the first slit formed in the barrier layer (the first inorganic film layer) 3 and having the width W1 in the lengthwise direction of the lead wiring lines TW; the second slit formed in the inorganic insulating film (the second inorganic film layer) 16 and having the width W2 in the lengthwise direction of the lead wiring lines TW; and a third slit formed in the inorganic insulating film (the third inorganic film layer) 18 and having a width W3 in the lengthwise direction of the lead wiring lines TW.

The first slit has the ends in the lengthwise direction of the lead wiring lines TW. Each of the ends is provided with one of the etch stop films (the first etch stop layers) 15a and 15b on the barrier layer (the first inorganic film layer) 3. The width W2, of the second slit, in the lengthwise direction of the lead wiring lines TW is greater than the width W1, of the first slit, in the lengthwise direction of the lead wiring lines TW.

Moreover, the second slit has ends in the lengthwise direction of the lead wiring lines TW. Each of the ends is provided with one of the etch stop films (the second etch stop layers) G3 and G4 on the inorganic insulating film (the second inorganic film layer) 16. The width W3, of the third slit, in the lengthwise direction of the lead wiring lines TW is greater than the width W2, of the second slit, in the lengthwise direction of the lead wiring lines TW.

Moreover, as illustrated in FIG. 6(a), the side faces of the second slit and the side faces of the etch stop films (the second etch stop layers) G3 and G4 may coincide at the ends, of the second slit, provided with the etch stop films G3 and G4.

As illustrated in FIG. 6(a), the lead wiring lines TW1 to TWn intersect with the slit CL, and make contact with the etch stop films 15a, 15b, G3, and G4.

Note that, in the flexible organic EL display device 1c, the slit CL has the ends each close to one of the display area DA and the terminal TM. The ends are each formed of a stepwise side face, including the etch stop films 15a, 15b, G3, and G4. Alternatively, the stepwise side face may be formed at only one end of the slit CL.

Furthermore, the end close to the display area DA may be formed of a stepwise side face including only the etch stop film (the first etch stop layer) 15a, and the other end close to the terminal TM may be formed of a stepwise side face including only the etch stop film (the second etch stop layer) G4. The end close to the display area DA may be formed of a stepwise side face including only the etch stop film (the second etch stop layer) G3, and the other end close to the terminal TM may be formed of a stepwise side face including only the etch stop film (the first etch stop layer) 15b.

Moreover, the slit CL has the ends each close to one of the display area DA and the terminal TM. The ends may be each formed of a stepwise side face, including only the etch stop films (the first etch stop layers) G3 and G4. Alternatively, the stepwise side face may be formed at only one end of the slit CL.

Note that the etch stop films G3 and G4 formed in the same layer as the gate electrode GE are conductive. Hence, as illustrated in FIG. 6(b), each of the etch stop films G3 and G4 is shaped into a plurality of islands formed along a side face of the slit CL. The islands of the films have to be formed to make contact with the lead wiring lines TW1 to TWn. That is, each of the islands of the films has to be formed to make contact with a corresponding one of the lead wiring lines TW1 to TWn.

Third Embodiment

Figure 7:
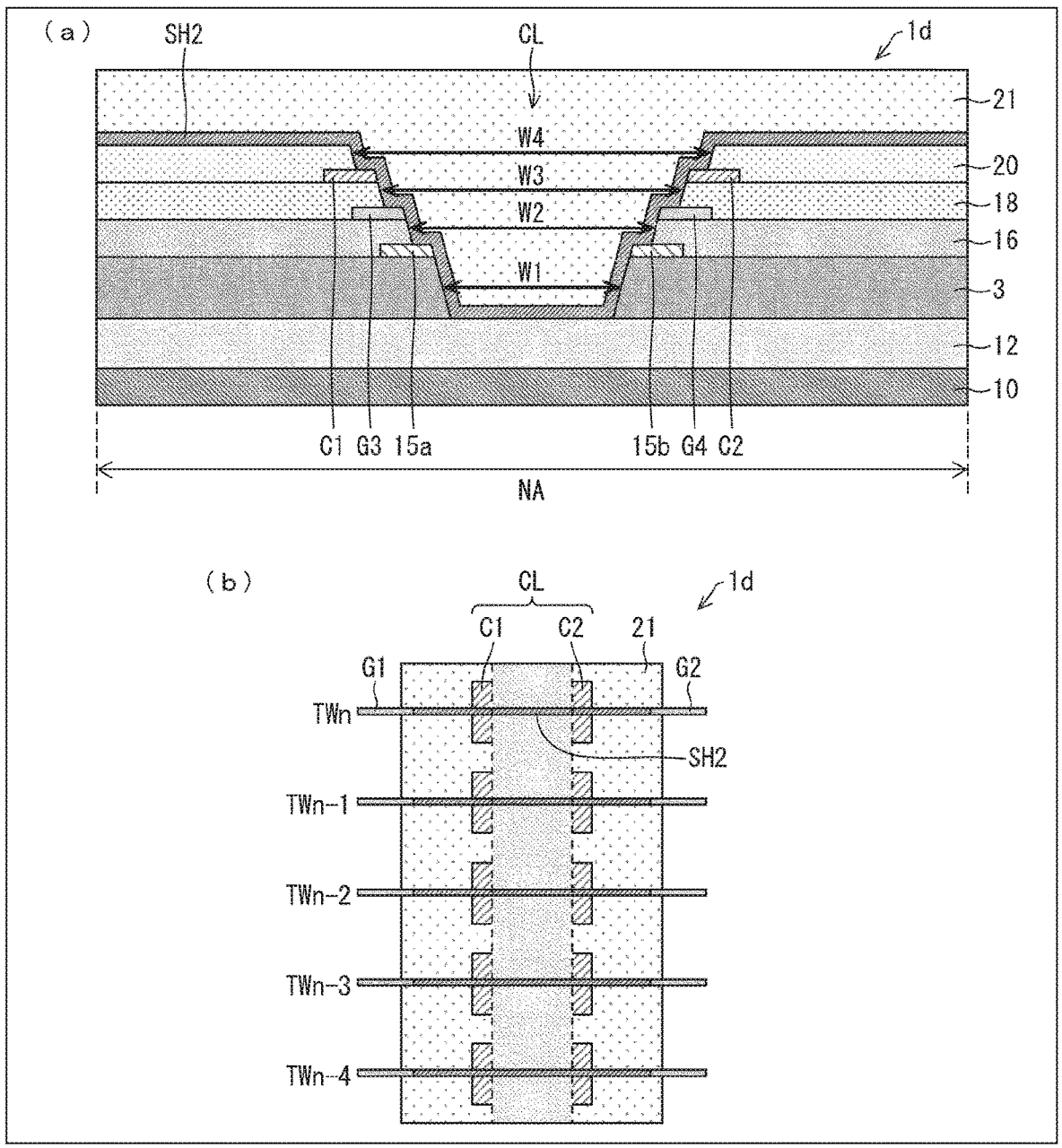
FIG. 7(a) is a cross-section view illustrating a folding slit formed in a frame area of a flexible organic EL display device including a top-gate TFT element according to a third embodiment.
FIG. 7(b) illustrates shapes of etch stop films included in the flexible organic EL display device according to the third embodiment.

Described next is a third embodiment of the disclosure, with reference to FIG. 7. A flexible organic EL display device 1d according to this embodiment is different from the flexible organic EL display devices according to the first and second embodiments. In addition to the etch stop films (the first etch stop layers) 15a and 15b formed using the same layer as the semiconductor film 15 and the etch stop films (the second etch stop layers) G3 and G4 formed in the same layer as the gate electrode GE, the flexible organic EL display device 1d further includes etch stop films (third etch stop layers) C1 and G2 formed in the same layer as the capacitance electrode CE and above the etch stop films 15a, 15b, G3 and G4. Other features are the same as those described in the first and second embodiments. In the detailed description that follows, identical constituent features have the same reference numerals between the drawings in this embodiment and the previous embodiments for the sake of description. Such constituent features will not be repeatedly elaborated.

FIG. 7(a) is a cross-section view illustrating the folding slit CL formed in the frame area NA of the flexible organic EL display device 1d including a top-gate TFT element. FIG. 7(b) illustrates shapes of portions of the etch stop films C1 and C2 included in the flexible organic EL display device 1d. Note that FIG. 7(b) omits the illustrations of the etch stop films 15a, 15b, G3, and G4.

As illustrated in FIG. 7(a), the slit CL has ends each close to one of the display area DA and the terminal TM. The ends are each formed of a stepwise side face, including the etch stop films 15a, 15b, G3, G4, C1 and C2.

As illustrated in FIG. 7(a), formed above the lower-face film 10 and the resin layer 12 are a plurality of inorganic film layers including, at least, the barrier layer (the first inorganic film layer) 3, the inorganic insulating film (the second inorganic film layer) 16 above the barrier layer 3, the inorganic insulating film (the third inorganic film layer) 18 above the inorganic insulating film 16, and the inorganic insulating film (the fourth inorganic film layer) 20 above the inorganic insulating film 18. The slit CL is formed in the inorganic film layers.

The slit CL includes: the first slit formed in the barrier layer (the first inorganic film layer) 3 and having the width W1 in the lengthwise direction of the lead wiring lines TW; the second slit formed in the inorganic insulating film (the second inorganic film layer) 16 and having the width W2 in the lengthwise direction of the lead wiring lines TW; the third slit formed in the inorganic insulating film (the third inorganic film layer) 18 and having the width W3 in the lengthwise direction of the lead wiring lines TW; and a fourth slit formed in the inorganic insulating film (the fourth inorganic film layer) 20 and having a width W4 in the lengthwise direction of the lead wiring lines TW.

The first slit has the ends in the lengthwise direction of the lead wiring lines TW. Each of the ends is provided with one of the etch stop films (the first etch stop layers) 15a and 15b on the barrier layer (the first inorganic film layer) 3. The width W2, of the second slit, in the lengthwise direction of the lead wiring lines TW is greater than the width W1, of the first slit, in the lengthwise direction of the lead wiring lines TW.

Moreover, the second slit has the ends in the lengthwise direction of the lead wiring lines TW. Each of the ends is provided with one of the etch stop films (the second etch stop layers) G3 and G4 on the inorganic insulating film (the second inorganic film layer) 16. The width W3, of the third slit, in the lengthwise direction of the lead wiring lines TW is greater than the width W2, of the second slit, in the lengthwise direction of the lead wiring lines TW.

Moreover, the third slit has ends in the lengthwise direction of the lead wiring lines TW. Each of the ends is provided with one of the etch stop films (the third etch stop layers) C1 and C2 on the inorganic insulating film (the third inorganic film layer) 18. The width W4, of the fourth slit, in the lengthwise direction of the lead wiring lines TW is greater than the width W3, of the third slit, in the lengthwise direction of the lead wiring lines TW.

Furthermore, as illustrated in FIG. 7(a), the side faces of the third slit and the side faces of etch stop films (the third etch stop layers) C1 and C2 may coincide at the ends, of the third slit, provided with the etch stop films C1 and C2.

As illustrated in FIG. 7(a), the lead wiring lines TW1 to TWn intersect with the slit CL, and make contact with the etch stop films 15a, 15b, G3, G4, C1 and C2.

Note that, in the flexible organic EL display device 1d, the slit CL has the ends each close to one of the display area DA and the terminal TM. The ends are each formed of a stepwise side face, including the etch stop films 15a, 15b, G3, G4, C1, and C2. Alternatively, the stepwise side face may be formed at only one end of the slit CL.

Moreover, the slit CL has the ends each close to one of the display area DA and the terminal TM. The ends may be each formed of a stepwise side face including only the etch stop films 15a and 15b, only the etch stop films G3 and G4, or only the etch stop films C1 and C2. Alternatively, the stepwise side face may be formed at only one end of the slit CL.

Note that the etch stop films C1 and C2 formed in the same layer as the capacitance electrode CE are conductive. Hence, as illustrated in FIG. 7(b), each of the etch stop films C1 and C2 is shaped into a plurality of islands formed along a side face of the slit CL. The islands of the films have to be formed to make contact with the lead wiring lines TW1 to TWn. That is, each of the islands of the films has to be formed to make contact with a corresponding one of the lead wiring lines TW1 to TWn.

Fourth Embodiment

Described next is a fourth embodiment of the disclosure, with reference to FIGS. 8 and 9. A flexible organic EL display device 1e according to this embodiment is different from the flexible organic EL display devices according to the first embodiment in that the flexible organic EL display device 1e includes a crack-increase reduction slit SL instead of the folding slit CL. Other features are the same as those described in the first embodiment. In the detailed description that follows, identical constituent features have the same reference numerals between the drawings in this embodiment and the first embodiment for the sake of description. Such constituent features will not be repeatedly elaborated.

Figure 8:
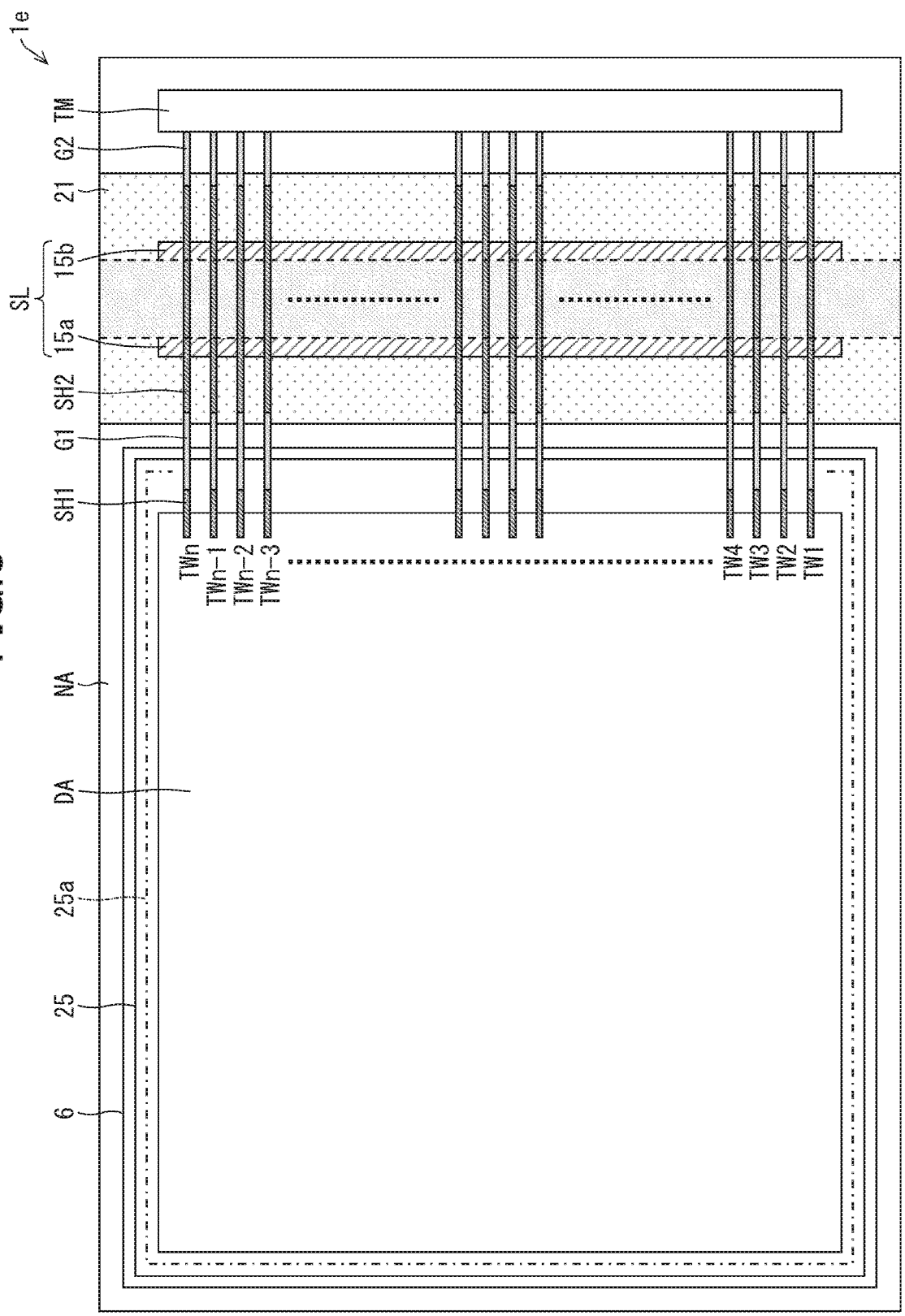
FIG. 8 is a plan view illustrating a schematic configuration of a flexible organic EL display device including a top-gate TFT element according to a fourth embodiment.

FIG. 8 is a plan view illustrating a schematic configuration of the flexible organic EL display device 1e including a top-gate TFT element.

Figure 9:
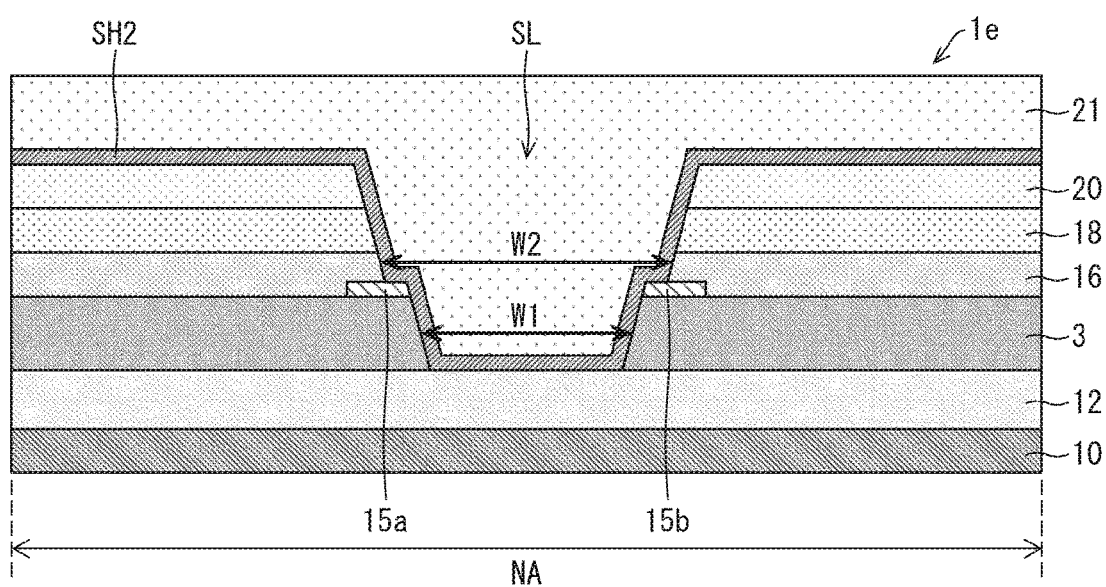
FIG. 9 is a cross-section view illustrating a crack-increase reduction slit formed in a frame area of the flexible organic EL display device according to the fourth embodiment.

FIG. 9 is a cross-section view illustrating the crack-increase reduction slit SL formed in the frame area NA of the flexible organic EL display device 1e.

The crack-increase reduction slit SL can be formed in the same manner as the folding slit CL described above. Hence the details thereof shall be omitted.

In the flexible organic EL display device 1e according to this embodiment, a crack formed in the terminal TM in press-fitting with an ACF can be kept from reaching toward the display area DA. In addition, the crack-increase reduction slit SL formed in the frame area NA has a stepwise side face including the etch stop film 15a and 15b. When the lead wiring lines TW1 to TWn are patterned in the slit SL, such features make it possible to reduce a residue between the lead wiring lines TW1 to TWn, contributing to reducing a leak between the lead wiring lines TW1 to TWn.

Note that the crack-increase reduction slit SL and the folding slit CL may be formed into the same shape, such that a single slit may be formed to be used for both of the crack-increase reduction and the folding.

Fifth Embodiment

Described next is a fifth embodiment of the disclosure, with reference to FIG. 10. Flexible organic EL display devices 1f to 1h according to this embodiment are different from the flexible organic EL display devices according to the first to fourth embodiments in that the flexible organic EL display devices 1f to 1h include a bottom-gate TFT element. Other features are the same as those described in the first to fourth embodiments. In the detailed description that follows, identical constituent features have the same reference numerals between the drawings in this embodiment and the previous embodiments for the sake of description. Such constituent features will not be repeatedly elaborated.

Figure 10:
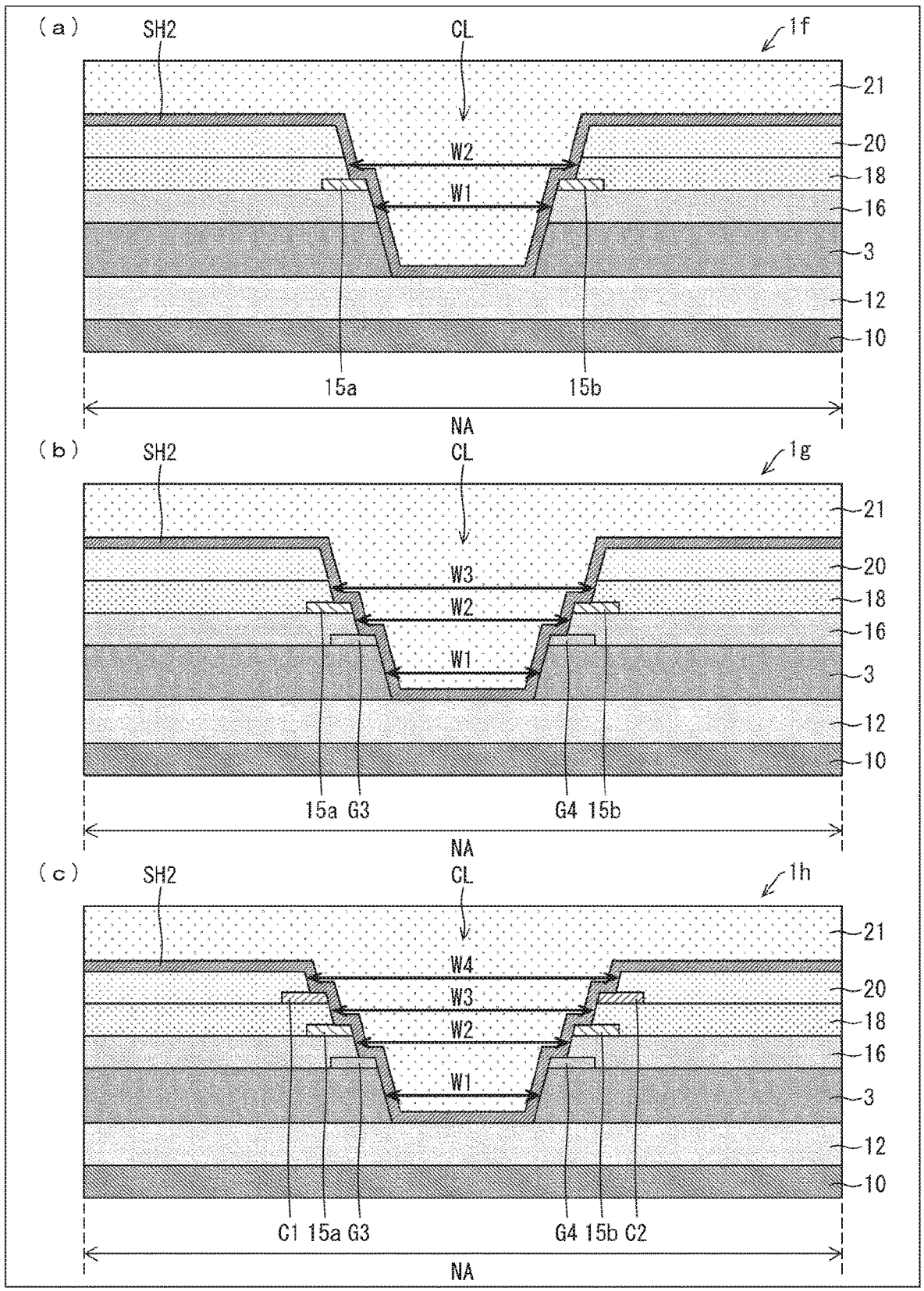
FIG. 10 is a cross-section view illustrating an example of a folding slit formed in a frame area of flexible organic EL display devices including a bottom-gate TFT element according to a fifth embodiment.

FIG. 10 is a cross-section view illustrating an example of the folding slit CL formed in the frame area NA of the flexible organic EL display devices 1f to 1h including a bottom-gate TFT element.

The flexible organic EL display device if illustrated in FIG. 10(a) includes the etch stop films (the first etch stop layer) 15a and 15b formed, using the same layer as the semiconductor film 15 included in the bottom-gate TFT element. The etch stop films 15a and 15b are formed on the organic insulating film 16.

The flexible organic EL display device 1g illustrated in FIG. 10(b) includes the etch stop films (the second etch stop layers) 15a and 15b formed, using the same layer as the semiconductor film 15 included in the bottom-gate TFT element. The flexible organic EL display device 1g further includes the etch stop films (the first etch stop layers) G3 and G4 formed in the same layer as the gate electrode GE included in the bottom-gate TFT element. The etch stop films G3 and G4 are formed below the etch stop films 15a and 15b.

The flexible organic EL display device 1h illustrated in FIG. 10(c) includes: the etch stop films (the second etch stop layers) 15a and 15b formed, using the same layer as the semiconductor film 15 included in the bottom-gate TFT element; and the etch stop films (the first etch stop layers) G3 and G4 formed in the same layer as the gate electrode GE included in the bottom-gate TFT element. The flexible organic EL display device 1h further includes the etch stop films (the third etch stop layers) C1 and C2 formed in the same layer as the capacitance electrode CE. The etch stop films C1 and C2 are formed above the etch stop films 15a, 15b, G3, and G4.

Summary

First Aspect

A display device includes, on a substrate, a display area including a plurality of display elements and a plurality of active elements, a frame area provided around the display area, and a plurality of terminals provided to an end of the frame area to each correspond to one of a plurality of lead wiring lines. The display device includes: a plurality of inorganic film layers formed on the substrate, the inorganic film layers including at least a first inorganic film layer and a second inorganic film layer above the first inorganic film layer; and a slit formed in the frame area and between the display area and the terminals, the slit being formed in the inorganic film layers, wherein the slit includes a first slit formed in the first inorganic film layer and a second slit formed in the second inorganic film layer, the first slit has ends in a lengthwise direction of the lead wiring lines, at least one of the ends being provided with a first etch stop layer on the first inorganic film, and a width, of the second slit, in the lengthwise direction of the lead wiring lines is greater than a width, of the first slit, in the lengthwise direction of the lead wiring lines.

Second Aspect

In the display device according to the first aspect, the first slit may have the ends in the lengthwise direction of the lead wiring lines, each of the ends being provided with the first etch stop layer on the first inorganic film layer.

Third Aspect

In the display device according to the first or second aspect, a side face of the first slit and a side face of the first etch stop layer may coincide at the ends, of the first slit, provided with the first etch stop layer.

Fourth Aspect

In the display device according to any one of the first to third aspects, the lead wiring lines may be metal wiring lines, the lead wiring lines may be formed to intersect with the slit, and the lead wiring lines may make contact with the first etch stop layer.

Fifth Aspect

The display device according to the fourth aspect may further include a first resin layer formed on the substrate, wherein the inorganic film layers may be formed on the first resin layer, the slit may be formed to expose the first resin layer, and each of the lead wiring lines may include a portion formed to make contact with the first resin layer.

Sixth Aspect

In the display device according to any one of the first to fifth aspects, the inorganic film layers may include a third inorganic film layer above the second inorganic film layer, the slit may include a third slit formed in the third inorganic film layer, the second slit may have ends in the lengthwise direction of the lead wiring lines, at least one the ends being provided with a second etch stop layer on the second inorganic film layer, and a width, of the third slit, in the lengthwise direction of the lead wiring lines may be greater than the width, of the second slit, in the lengthwise direction of the lead wiring lines.

Seventh Aspect

In the display device according to the sixth aspect, the second slit may have the ends in the lengthwise direction of the lead wiring lines, each of the ends being provided with the second etch stop layer on the second inorganic film layer.

Eighth Aspect

In the display device according to the sixth or seventh aspect, a side face of the second slit and a side face of the second etch stop layer may coincide at the ends, of the second slit, provided with the second etch stop layer.

Ninth Aspect

In the display device according to any one of the sixth to eighth aspects, the inorganic film layers may include a fourth inorganic film layer above the third inorganic film layer, the slit may include a fourth slit formed in the fourth inorganic film layer, the third slit may have ends in the lengthwise direction of the lead wiring lines, at least one of the ends being provided with a third etch stop layer on the third inorganic film layer, and a width, of the fourth slit, in the lengthwise direction of the lead wiring lines may be greater than the width, of the third slit, in the lengthwise direction of the lead wiring lines.

Tenth Aspect

In the display device according to the ninth aspect, the third slit may have the ends in the lengthwise direction of the lead wiring lines, each of the ends being provided with the third etch stop layer on the third inorganic film layer.

Eleventh Aspect

In the display device according to the ninth or tenth aspect, a side face of the third slit and a side face of the third etch stop layer may coincide at the ends, of the third slit, provided with the third etch stop layer.

Twelfth Aspect

In the display device according to any one of the ninth to eleventh aspects, the first inorganic film layer may be an inorganic moisture-resistant layer, the second inorganic film layer may be formed in the same layer as a gate insulating film layer included in the active elements, the third inorganic film layer may be formed in the same layer as a first inorganic insulating film layer included in the active elements, and the fourth inorganic film layer may be formed in the same layer as a second inorganic insulating film layer included in the active elements.

Thirteenth Aspect

The display device according to the twelfth aspect may further include a capacitance element including a capacitance electrode layer formed between the third inorganic film layer and the fourth inorganic film layer, wherein the first etch stop layer may be formed in one of (i) the same layer as a semiconductor layer included in the active elements and (ii) the same layer as a gate electrode layer included in the active elements, the second etch stop layer may be formed in an other one of (i) the same layer as the semiconductor layer included in the active elements and (ii) the same layer as the gate electrode layer included in the active elements, and the third etch stop layer may be formed in the same layer as the capacitance electrode layer.

Fourteenth Aspect

In the display device according to any one of the first to thirteenth aspects, the slit may form a folding portion, and the lead wiring lines are covered with a second resin layer.

Fifteenth Aspect

In the display device according to any one of the first to fourteenth aspects, the first etch stop layer may be formed in the same layer as the semiconductor layer included in the active elements, the first etch stop layer may be shaped into an island, and the island of the first etch stop layer may make contact with different two or more of the lead wiring lines.

Sixteenth Aspect

In the display device according to any one of the first to fourteenth aspects, the first etch stop layer may be formed of the same layer as the semiconductor layer included in the active elements, the first etch stop layer may be shaped into a plurality of islands, and each of the islands of the first etch stop layer may make contact with a different one of the lead wiring lines.

Seventeenth Aspect

In the display device according to any one of the first to fourteenth aspects, the first etch stop layer may be formed of the same layer as the semiconductor layer included in the active elements, the first etch stop layer may be shaped into a plurality of islands, and at least one of the islands of the first etch stop layer may make contact with different two or more of the lead wiring lines.

Eighteenth Aspect

In the display device according to any one of the first to fourteenth aspects, the first etch stop layer may be formed of a metallic material, the first etch stop layer may be shaped into a plurality of islands, and each of the islands of the first etch stop layer may make contact with a different one of the lead wiring lines.

Nineteenth Aspect

In the display device according to any one of the first to eighteenth aspects, the slit may be formed across opposing ends, of the substrate, in a direction orthogonal to the lengthwise direction of the lead wiring lines, and the first etch stop layer may be formed inward of the opposing ends.

Additional Remarks

The disclosure shall not be limited to the embodiments described above, and can be modified in various manners within the scope of claims. The technical aspects disclosed in different embodiments are to be appropriately combined together to implement an embodiment. Such an embodiment shall be included within the technical scope of the disclosure. Moreover, the technical aspects disclosed in each embodiment are combined to achieve a new technical feature.

INDUSTRIAL APPLICABILITY

The disclosure is applicable to a display device.

REFERENCE SIGNS LIST 1, and 1a to 1h Flexible Organic EL Display Device, 3 Barrier Layer, 4 TFT Layer, 5 Organic EL Element Layer, 6 Sealing Layer, 12 Resin Layer, 16, 18, 20 Inorganic Insulating Film, 21 Planarization Film, CL Folding Slit, SL Crack-Increase Reduction Slit, DA Display Area, NA Frame Area, TM Terminal, TW1 to TWn Lead Wiring Lines, Tr Thin-Film Transistor, GE Gate Electrode, SH Source And Drain Wiring line, CE Capacitance Electrode, 15a, 15b, G3, G4, C1, and C2 Etch Stop Layers, SH1 First Conductive Member, SH2 Second Conductive Member, G1 Third Conductive Member, G2 Fourth Conductive Member

The invention claimed is:
1. A display device including, on a substrate,
a display area including a plurality of display elements and a plurality of active elements, a frame area provided around the display area, and a plurality of terminals provided to an end of the frame area to each correspond to one of a plurality of lead wiring lines, the display device comprising:
a plurality of inorganic film layers formed on the substrate, the plurality of inorganic film layers including at least a first inorganic film layer, a second inorganic film layer above the first inorganic film layer, a third inorganic film layer above the second inorganic film layer, and a fourth inorganic film layer above the third inorganic film layer; and
a slit formed in the frame area and between the display area and the terminals, the slit being formed in the plurality of inorganic film layers, wherein
the slit includes a first slit formed in the first inorganic film layer, a second slit formed in the second inorganic film layer, a third slit formed in the third inorganic film layer, and a fourth slit formed in the fourth inorganic film layer,
the first slit has ends in a lengthwise direction of the lead wiring lines, at least one of the ends being provided with a first etch stop layer on the first inorganic film layer,
the second slit has ends in the lengthwise direction of the lead wiring lines, at least one the ends being provided with a second etch stop layer on the second inorganic film layer,
the third slit has ends in the lengthwise direction of the lead wiring lines, at least one of the ends being provided with a third etch stop layer on the third inorganic film layer,
a width of the second slit in the lengthwise direction of the lead wiring lines is greater than a width of the first slit in the lengthwise direction of the lead wiring lines,
a width of the third slit in the lengthwise direction of the lead wiring lines is greater than the width of the second slit in the lengthwise direction of the lead wiring lines, and
a width of the fourth slit in the lengthwise direction of the lead wiring lines is greater than the width of the third slit in the lengthwise direction of the lead wiring lines.
2. The display device according to claim 1, wherein
the first slit has the ends in the lengthwise direction of the lead wiring lines, each of the ends being provided with the first etch stop layer on the first inorganic film layer.

3. The display device according to claim 1, wherein
a side face of the first slit and a side face of the first etch stop layer coincide at the ends of the first slit provided with the first etch stop layer.
4. The display device according to claim 1, wherein
the lead wiring lines are metal wiring lines,
the lead wiring lines are formed to intersect with the slit, and
the lead wiring lines make contact with the first etch stop layer.
5. The display device according to claim 1, further comprising
a first resin layer formed on the substrate, wherein
the plurality of inorganic film layers are formed on the first resin layer,
the slit is formed to expose the first resin layer, and
each of the lead wiring lines includes a portion formed to make contact with the first resin layer.
6. The display device according to claim 1, wherein
the second slit has the ends in the lengthwise direction of the lead wiring lines, each of the ends being provided with the second etch stop layer on the second inorganic film layer.
7. The display device according to claim 1, wherein
a side face of the second slit and a side face of the second etch stop layer coincide at the ends of the second slit provided with the second etch stop layer.
8. The display device according to claim 1, wherein
the third slit has the ends in the lengthwise direction of the lead wiring lines, each of the ends being provided with the third etch stop layer on the third inorganic film layer.
9. The display device according to claim 1, wherein
a side face of the third slit and a side face of the third etch stop layer coincide at the ends of the third slit provided with the third etch stop layer.
10. The display device according to claim 1, wherein
the first inorganic film layer is an inorganic moisture-resistant layer,
the second inorganic film layer is formed in the same layer as a gate insulating film layer included in the active elements,
the third inorganic film layer is formed in the same layer as a first inorganic insulating film layer included in the active elements, and
the fourth inorganic film layer is formed in the same layer as a second inorganic insulating film layer included in the active elements.
11. The display device according to claim 1, further comprising
a capacitance element including a capacitance electrode layer formed between the third inorganic film layer and the fourth inorganic film layer, wherein
the first etch stop layer is formed in one of (i) the same layer as a semiconductor layer included in the active elements and (ii) the same layer as a gate electrode layer included in the active elements,
the second etch stop layer is formed in another one of (i) the same layer as the semiconductor layer included in the active elements and (ii) the same layer as the gate electrode layer included in the active elements, and
the third etch stop layer is formed in the same layer as the capacitance electrode layer.
12. The display device according to claim 5, wherein
the slit forms a folding portion, and
the lead wiring lines are covered with a second resin layer.
13. The display device according to claim 1, wherein
the first etch stop layer is formed in the same layer as a semiconductor layer included in the active elements,
the first etch stop layer is shaped into an island, and
the island of the first etch stop layer makes contact with different two or more of the lead wiring lines.
14. The display device according to claim 1, wherein
the first etch stop layer is formed in the same layer as a semiconductor layer included in the active elements,
the first etch stop layer is shaped into a plurality of islands, and
each of the islands of the first etch stop layer makes contact with a different one of the lead wiring lines.
15. The display device according to claim 1, wherein
the first etch stop layer is formed in the same layer as a semiconductor layer included in the active elements,
the first etch stop layer is shaped into a plurality of islands, and
at least one of the islands of the first etch stop layer makes contact with different two or more of the lead wiring lines.
16. The display device according to claim 1, wherein
the first etch stop layer is formed of a metallic material,
the first etch stop layer is shaped into a plurality of islands, and
each of the islands of the first etch stop layer makes contact with a different one of the lead wiring lines.
17. The display device according to claim 1, wherein
the slit is formed across opposing ends of the substrate in a direction orthogonal to the lengthwise direction of the lead wiring lines, and
the first etch stop layer is formed inward of the opposing ends.
18. A display device including, on a substrate,
a display area including a plurality of display elements and a plurality of active elements, a frame area provided around the display area, and a plurality of terminals provided to an end of the frame area to each correspond to one of a plurality of lead wiring lines, the display device comprising:
a plurality of inorganic film layers formed on the substrate, the plurality of inorganic film layers including at least a first inorganic film layer and a second inorganic film layer above the first inorganic film layer; and
a slit formed in the frame area and between the display area and the terminals, the slit being formed in the plurality of inorganic film layers, wherein
the slit includes a first slit formed in the first inorganic film layer and a second slit formed in the second inorganic film layer,
the first slit has ends in a lengthwise direction of the lead wiring lines, at least one of the ends being provided with a first etch stop layer on the first inorganic film layer,
the first etch stop layer is formed in the same layer as a semiconductor layer included in the active elements,
the first etch stop layer is shaped into an island,
the island of the first etch stop layer makes contact with different two or more of the lead wiring lines, and
a width of the second slit in the lengthwise direction of the lead wiring lines is greater than a width of the first slit in the lengthwise direction of the lead wiring lines.
19. A display device including, on a substrate,
a display area including a plurality of display elements and a plurality of active elements, a frame area provided around the display area, and a plurality of terminals provided to an end of the frame area to each correspond to one of a plurality of lead wiring lines, the display device comprising:

a plurality of inorganic film layers formed on the substrate, the plurality of inorganic film layers including at least a first inorganic film layer and a second inorganic film layer above the first inorganic film layer; and a slit formed in the frame area and between the display area and the terminals, the slit being formed in the plurality of inorganic film layers, wherein the slit includes a first slit formed in the first inorganic film layer and a second slit formed in the second inorganic film layer, the first slit has ends in a lengthwise direction of the lead wiring lines, at least one of the ends being provided with a first etch stop layer on the first inorganic film layer, the first etch stop layer is formed in the same layer as a semiconductor layer included in the active elements, the first etch stop layer is shaped into a plurality of islands, at least one of the islands of the first etch stop layer makes contact with different two or more of the lead wiring lines, and a width of the second slit in the lengthwise direction of the lead wiring lines is greater than a width of the first slit in the lengthwise direction of the lead wiring lines.

* * * * *